United States Patent
Shieh

(10) Patent No.: US 8,816,788 B2
(45) Date of Patent: Aug. 26, 2014

(54) FREQUENCY GENERATOR WITH FREQUENCY JITTER

(75) Inventor: Tzong-Honge Shieh, Taipei (TW)

(73) Assignee: Analog Vision Technology Inc., New Taipei (TW)

( * ) Notice: Subject to any disclaimer, the term of this patent is extended or adjusted under 35 U.S.C. 154(b) by 699 days.

(21) Appl. No.: 13/093,864

(22) Filed: Apr. 26, 2011

(65) Prior Publication Data

US 2012/0081082 A1    Apr. 5, 2012

(30) Foreign Application Priority Data

Sep. 30, 2010   (TW) ............................... 99133177 A

(51) Int. Cl.
   *H03K 3/0231*   (2006.01)
   *H03K 4/501*    (2006.01)
   *H03K 3/84*     (2006.01)
   *G06F 1/08*     (2006.01)

(52) U.S. Cl.
   CPC ............... *H03K 3/84* (2013.01); *H03K 3/0231* (2013.01); *G06F 1/08* (2013.01)
   USPC ............................. 331/143; 331/111; 331/78

(58) Field of Classification Search
   CPC ............... H03K 3/0231; H03K 3/012; H03K 4/50–4/502
   USPC ................................. 331/111, 143, 78, 177 R
   See application file for complete search history.

(56) References Cited

U.S. PATENT DOCUMENTS

| | | | | |
|---|---|---|---|---|
| 5,859,571 | A | * | 1/1999 | Lee et al. ..................... 331/53 |
| 6,914,494 | B1 | * | 7/2005 | Chen ............................ 331/111 |
| 7,420,431 | B2 | * | 9/2008 | Hwang et al. ................ 331/143 |
| 2005/0242892 | A1 | | 11/2005 | Ma et al. |

FOREIGN PATENT DOCUMENTS

| | | |
|---|---|---|
| CN | 101499787 | 8/2009 |
| CN | 101562442 | 10/2009 |
| CN | 101635504 | 1/2010 |

OTHER PUBLICATIONS

"Office Action of China Counterpart Application", issued on Nov. 15, 2013, p. 1-p. 6.

* cited by examiner

*Primary Examiner* — Ryan Johnson

(74) *Attorney, Agent, or Firm* — Jianq Chyun IP Office

(57) ABSTRACT

A frequency generator with frequency jitter is disclosed. The frequency generator comprises a capacitor, a comparing unit, a charging and discharging unit, a delay unit, and a charging and discharging switch unit. The comparing unit is coupled to the capacitor and generates a charging and discharging control signal according to a voltage of the capacitor. The charging and discharging unit is coupled to the capacitor. The delay unit is coupled to the comparing unit and receives a delay signal. The delay unit delays the charging and discharging control signal according to the delay signal to generate a charging and discharging delay signal. The charging and discharging switch unit is coupled to the charging and discharging unit and the delay unit, and charges or discharges the capacitor according to the charging and discharging delay signal.

6 Claims, 2 Drawing Sheets

FREQUENCY GENERATOR WITH FREQUENCY JITTER

CROSS-REFERENCE TO RELATED APPLICATION

This application claims the priority benefit of Taiwan application serial no. 99133177, filed Sep. 30, 2010. The entirety of the above-mentioned patent application is hereby incorporated by reference herein and made a part of this specification.

BACKGROUND OF THE INVENTION (1) Field of the Invention

The present invention relates to a frequency generator, and more particularly relates to a frequency generator with frequency jitter.

(2) Description of the Prior Art

FIG. 1 is a circuit diagram of a typical frequency generator. As shown, the frequency generator has a first current source I1 and a second current source I2 utilized for charging and discharging a capacitor C through a first switch SW1 and a second switch SW2 respectively. The first comparator COM1 has an inverted end receiving a first reference voltage V1 and an non-inverted end coupled to the capacitor C for comparing a voltage signal from the capacitor C and the first reference voltage V1. The second comparator COM2 has an non-inverted end receiving a second reference voltage V2 and an inverted end coupled to the capacitor C for comparing a voltage signal from the capacitor C and the second reference voltage V2. A SR flip-flop SRIN receives the output signals from the first comparator COM1 and the second comparator COM2 so as to generate a clock signal CLK utilized as the control signal for the first switch SW1 and the second switch SW2. As the clock signal CLK is high, the first switch SW1 is turned off and the second switch SW2 is turned on to have the second current source I2 discharging the capacitor C. As the gradually declined voltage level of the capacitor C reaches the second reference voltage V2, the second comparator COM2 generates a high-level output signal to have the clock signal CLK shifted to low. When the clock signal CLK is low, the first switch SW1 is turned on and the second switch SW2 is turned off to have the first current source I1 charging the capacitor C. As the gradually increasing voltage level of the capacitor C reaches the first reference voltage V1, the first comparator COM1 generates a high-level output signal to have the clock signal CLK shifted to high. Since the potential difference between the first reference voltage V1 and the second reference voltage V2 is constant and the current flows of the first current source I1 and the second current source I2 are fixed, the clock signal CLK with constant frequency can be generated.

For the above mentioned frequency generator, the clock signal CLK with frequency jitter can be achieved by jittering the current flows of the first current source I1 and the second current source I2 or the voltage levels of the first reference voltage V1 and the second reference voltage level V2. However, such methods are only suitable for the condition of regular and slow jittering, and cannot fulfill the demand of random and fast jittering.

SUMMARY OF THE INVENTION

Since the prior art frequency generator cannot offer a clock signal with fast and random jittering, the present invention postpones the logic transition point of the clock signal (i.e. from high to low and from low to high) from the frequency generator so as to achieve the object of fast and random jittering.

To achieve the above mentioned object, a frequency generator with frequency jitter is provided in accordance with the present invention. The frequency generator has a capacitor, a comparing unit, a charging/discharging unit, a delaying unit, and a charging/discharging switch unit. The comparing unit is coupled to the capacitor for generating a charging/discharging control signal according to a voltage signal from the capacitor. The charging/discharging unit is coupled to the capacitor. The delaying unit is coupled to the comparing unit for receiving a delay signal and postponing the charging/discharging control signal according to the delay signal so as to generate a delayed charging/discharging signal. The charging/discharging switch unit is coupled to the charging/discharging unit and the delaying unit, and is utilized for controlling the charging/discharging unit to charge or discharge the capacitor according to the delayed charging/discharging signal.

BRIEF DESCRIPTION OF THE DRAWINGS

The present invention will now be specified with reference to its preferred embodiment illustrated in the drawings.

DESCRIPTION OF THE PREFERRED EMBODIMENT

Figure 1:
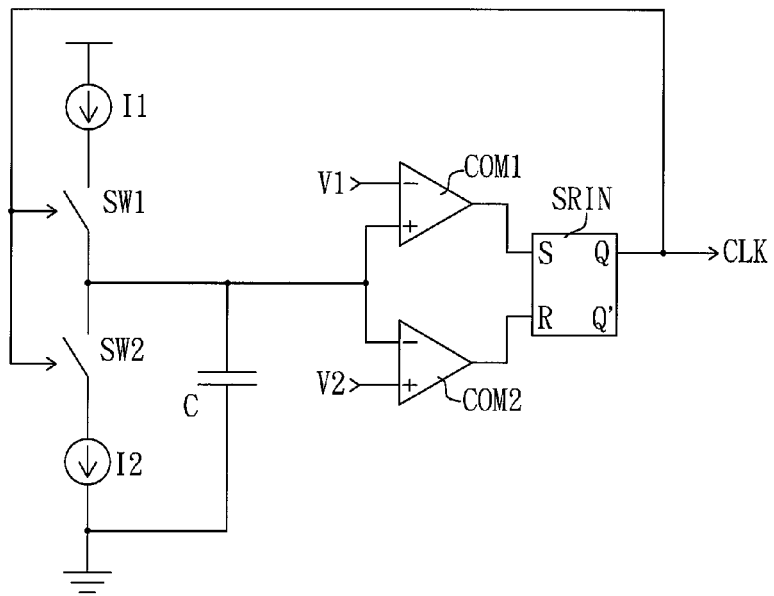
FIG. 1 is a circuit diagram of a typical frequency generator.
Figure 2:
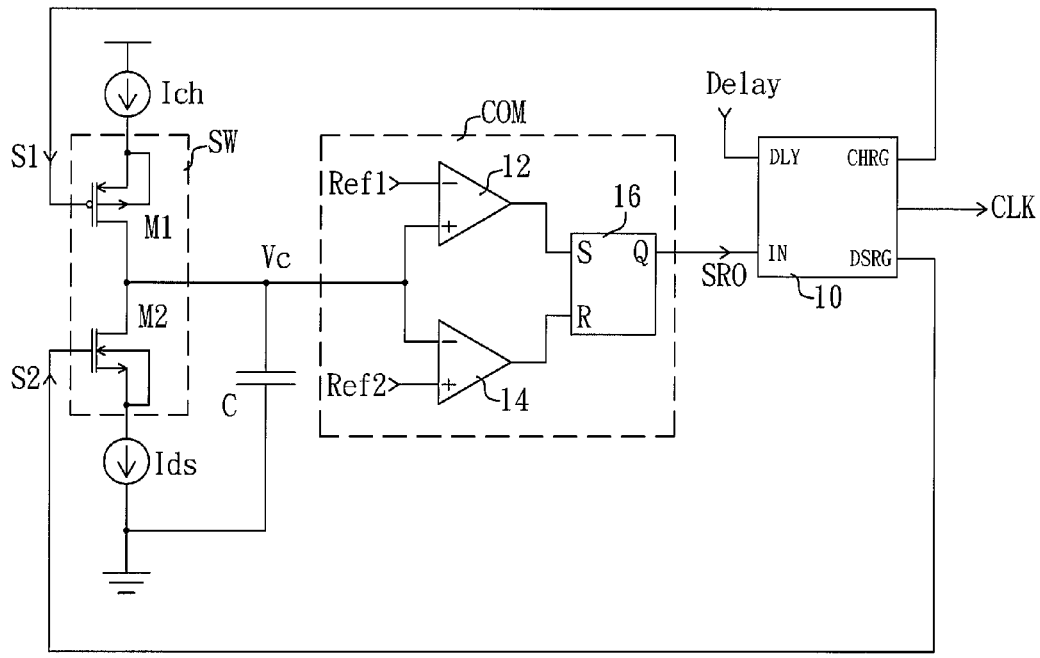
FIG. 2 is a circuit diagram of a frequency generator with frequency jitter in accordance with a preferred embodiment of the present invention.

FIG. 2 is a circuit diagram of a frequency generator with frequency jitter in accordance with a preferred embodiment of the present invention. As shown, the frequency generator has a capacitor C, a comparing unit COM, a charging/discharging unit, a delaying unit 10, and a charging/discharging switch unit SW. The charging/discharging unit has a charging current source Ich and a discharging current source Ids. The comparing unit COM is coupled to the capacitor C and generates a charging/discharging control signal SRO according to a voltage signal Vc from the capacitor C. The delaying unit 10 is coupled to the comparing unit COM and receives a delay signal Delay from an input end DLY thereof. The delaying unit 10 generates the delayed charging/discharging signal including a first control signal S1 at a charging control end CHRG and a second control signal S2 at a discharging control end DSRG according to the delay signal Delay and the charging/discharging control signal SRO. The charging/discharging switch unit SW is coupled to the charging/discharging unit and the delay unit 10, and controls the charging and discharging motions of the charging current source Ich and the discharging current source Ids according to the first control signal S1 and the second control signal S2 respectively so as to change the level of the voltage signal Vc of the capacitor C. The charging/discharging switch unit SW in the present embodiment has a charging switch M1 and a discharging switch M2, which are alternatively turned on. That is, as the charging switch M1 is turned on, the discharging switch M2 is turned off, and vice versa. In the present embodiment, the charging switch M1 is a p-type metal-oxide-semiconductor transistor and the discharging switch M2 is an n-type metal-oxide-semiconductor transistor such that the above mentioned requirement of on/off control can be achieved by using a single control signal. That is, the above mentioned first control signal S1 and the second control signal S2 can be the same. However, according to the need of circuit design, a delay time can be set between the ending of the first control signal S1 and the beginning of the second control signal S2, and/or the ending of the second control signal S2 and the beginning of the first control signal S1. In the present embodiment, the delay time between the first control signal S1 and the second control signal S2 is set according to the delay signal Delay.

Figure 3:
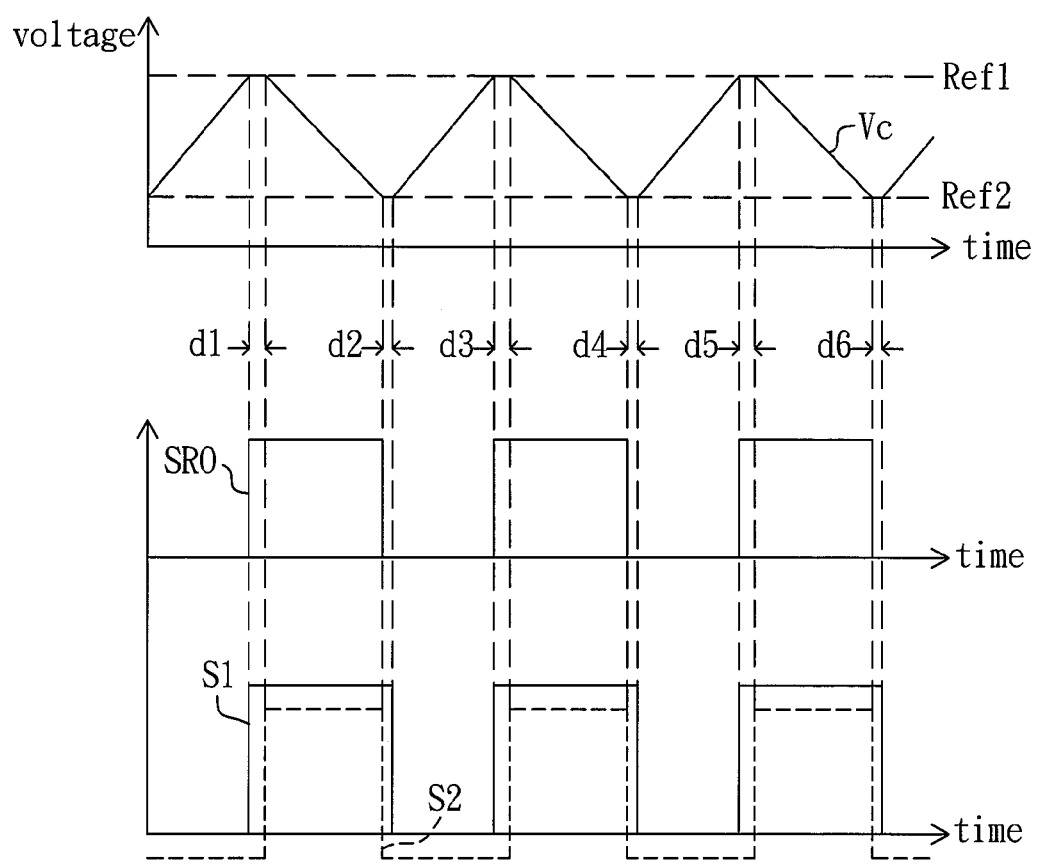
FIG. 3 is a diagram showing the waveforms of the signal in the frequency generator of FIG. 2.

For a better understanding of the present invention, a detailed description of the operation of the frequency generator is mentioned below. Referring to FIG. 2 and FIG. 3, which shows the waveforms of the signals in the frequency generator of FIG. 2, the comparing unit COM has a discharging comparator 12, a charging comparator 14, and a SR flip-flop 16. The inverted input end of the discharging comparator 12 receives a first reference signal Ref1, the non-inverted input end of the charging comparator 14 receives a second reference signal Ref2, and the voltage level of the first reference signal Ref1 is higher than that of the second reference signal Ref2. The output end of the discharging comparator 12 is coupled to a set input S of the SR flip-flop 16. The output end of the charging comparator 14 is coupled to the reset input R of the SR flip-flop 16.

When the capacitor C is being charged, the level of the voltage signal Vc would gradually increase. As the voltage signal Vc reaches the level of the first reference signal Ref1, the discharging comparator 12 may output a high-level signal to the set input S of the SR flip-flop 16 so as to shift the voltage level of the charging/discharging control signal SRO at the output Q of the SR flip-flop 16 to high level and simultaneously trigger the delaying unit 10 to shift the first control signal S1 to high level. The delaying unit 10 modulates the transition point of the second control signal S2 from low level to high level with a delay time d1,d3 and d5 as shown in FIG. 3 corresponding to the transition point of the charging/discharging control signal SRO according to the delay signal Delay. Thus, after the charging/discharging control signal SRO has been shift to high level for a while, the second control signal S2 is shift to high level. In addition, since the first control signal S1 has been shifted to high level to turn off the charging switch M1 in the time period between the transition points of the charging/discharging control signal SRO and the second control signal S2, the level of the voltage signal Vc would be maintained at the level of the first reference signal Ref1. After the second control signal S2 has been shifted to high level, the discharging switch M2 is turned on and the discharging current source Ids begins to discharge the capacitor C. At this time, the capacitor C is discharging and the voltage level of the voltage signal Vc begins to fall. Then, as the voltage level of the declining voltage signal Vc reaches the voltage level of the second reference signal Ref2, the charging comparator 14 outputs a high level signal to the reset input R of the SR flip-flop 16 to have the charging/discharging control signal SRO at the output Q of the SR flip-flop 16 shifted to low level and trigger the delaying unit 10 to have the voltage level of the second control signal S2 shifted to low. The delaying unit 10 postpones the transition point of the first control signal S1 from high level to low level with a delay time d2,d4 and d6 in FIG. 3 corresponding to the logic transition point of the charging/discharging control signal SRO according to the delay signal Delay. Thus, after the charging/discharging control signal SRO has been shifted to low level for a while, the first control signal S1 is shifted to low level. In addition, since the second control signal S2 has been shifted to low level to turn off the discharging switch M2 in the time period between the transition points of the charging/discharging control signal SRO and the first control signal S1, the level of the voltage signal Vc would be maintained at the level of the second reference signal Ref2. After the first control signal S1 is shifted to low level, the charging switch M1 is turned on, the charging current source Ich begins to charge the capacitor C, and the level of the voltage signal Vc begins to increase.

In the present embodiment, frequency jitter may be added to the charging/discharging control signal SRO, the first control signal S1, or the second control signal S2, such that the clock signal CLK outputted from the delaying unit 10 according to one of the above mentioned signals may represent frequency jitter. The delay signal may be a noise signal, a digital signal, a random signal, and etc. As the delay signal Delay is a noise signal, the delaying unit 10 may change the delay time according to the level of the noise signal. As the delay signal Delay is a digital random signal, the delaying unit 10 may be a digital circuit which sets the delay time according to the digital random signal. In particular, the delay signal Delay may be come from a programmable digital circuit so as to have the frequency generator generate a frequency signal with a programmable jitter.

While the preferred embodiments of the present invention have been set forth for the purpose of disclosure, modifications of the disclosed embodiments of the present invention as well as other embodiments thereof may occur to those skilled in the art. Accordingly, the appended claims are intended to cover all embodiments which do not depart from the spirit and scope of the present invention.

What is claimed is:

1. A frequency generator with frequency jitter, comprising:
a capacitor;
a comparing unit, coupled to the capacitor for generating a charging/discharging control signal according to a voltage signal from the capacitor;
a charging/discharging unit, coupled to the capacitor;
a delaying unit, coupled to the comparing unit for receiving a delay signal and postponing the charging/discharging control signal according to the delay signal so as to generate a delayed charging/discharging signal;
a charging/discharging switch unit, coupled to the charging/discharging unit and the delaying unit, controlling the charging/discharging unit to charge or discharge the capacitor according to the delayed charging/discharging signal,
wherein the comparing unit has a first comparator and a second comparator, an inverted input end of the first comparator receives a first reference voltage, an non-inverted input end of the second comparator receives a second reference voltage, an non-inverted input end of the first comparator and an inverted input end of the second comparator are coupled to the capacitor, and a voltage level of the first reference voltage is higher than that of the second reference voltage.

2. The frequency generator with frequency jitter of claim 1, wherein the comparing unit has a flip-flop circuit, which receives output signals from the first comparator and the second comparator and generates the charging/discharging control signal accordingly, and the charging/discharging control signal is a pulse signal.

3. The frequency generator with frequency jitter of claim 1, wherein a time difference between a transition point of the delayed charging/discharging signal and a transition point of the charging/discharging control signal depends on the delay signal, and the delayed charging/discharging signal is a pulse signal.

4. The frequency generator with frequency jitter of claim 3, wherein the comparing unit has a first comparator and a second comparator, an inverted input end of the first comparator receives a first reference voltage, an non-inverted input end of the second comparator receives a second reference voltage, an non-inverted input end of the first comparator and an inverted input end of the second comparator are coupled to the capacitor, and a voltage level of the first reference voltage is higher than that of the second reference voltage.

5. The frequency generator with frequency jitter of claim 4, wherein the comparing unit has a flip-flop circuit, which receives output signals from the first comparator and the second comparator and generates the charging/discharging control signal accordingly.

6. The frequency generator with frequency jitter of claim 5, wherein the charging/discharging unit has a charging current source for charging the capacitor and a discharging current source for discharging the capacitor.

* * * * *